United States Patent [19]
Sato

[11] Patent Number: 5,950,968
[45] Date of Patent: Sep. 14, 1999

[54] WIRE HOLDER AND WIRE HOLDER ASSEMBLY

[75] Inventor: Kyotaro Sato, Tokyo, Japan

[73] Assignee: Kyoshin Kogyo Co., Ltd., Tokyo, Japan

[21] Appl. No.: 09/110,848

[22] Filed: Jul. 7, 1998

Related U.S. Application Data

[62] Division of application No. 08/377,248, Jan. 24, 1995, Pat. No. 5,797,566.

[30] Foreign Application Priority Data

Aug. 24, 1994 [JP] Japan .................................. 6-199364

[51] Int. Cl.⁶ ...................................................... H02B 3/00
[52] U.S. Cl. .............................. 248/49; 174/72 A; 248/65
[58] Field of Search ............................... 248/49, 65, 68.1, 248/74.2; 361/760, 773, 809, 826; 174/72 A, 255

[56] References Cited

U.S. PATENT DOCUMENTS

| | | |
|---|---|---|
| 2,896,009 | 7/1959 | Caveney . |
| 3,022,973 | 2/1962 | Morrow et al. . |
| 3,588,081 | 6/1971 | Logan et al. . |
| 3,960,425 | 6/1976 | Kirk, Jr. et al. . |
| 4,507,710 | 3/1985 | Jung . |

FOREIGN PATENT DOCUMENTS

| | | |
|---|---|---|
| 1224204 | 6/1960 | France . |
| 3432026 | 3/1985 | Germany . |
| 2276500 | 9/1994 | United Kingdom . |

OTHER PUBLICATIONS

IBM Technical Disclosure Bulletin, vol. 12, No. 11, p. 1882 (Apr., 1970).
IBM Technical Disclosure Bulletin, vol. 20, No. 11A, p. 4309 (Apr., 1978).
IBM Technical Disclosure Bulletin, vol. 20, No. 12, p. 5141 (May, 1978).
IBM Technical Disclosure Bulletin, vol. 21, No. 2, p. 509 (Jul., 1978).

*Primary Examiner*—Derek J. Berger
*Attorney, Agent, or Firm*—Birch, Stewart, Kolasch & Birch, LLP

[57] ABSTRACT

A wire holder has legs and wire holding pieces which are formed integrally with a holder body. The wire holding pieces are formed in a manner such that there is no gap when the holding pieces are projected on a first plane which contains the holder body, and that there is a gap when the wire holding pieces are projected on a second plane which intersects the first plane. The wire introduced into a wire holding space is held in position. The wire holder can be automatically mounted on a circuit board, and the wire holding operation by means of the wire holder can be performed easily and securely. A wire holder assembly has a lead frame formed with a plurality of holes which are arranged at regular intervals and into which feed teeth of an automatic loader are engagedly fitted individually, and a plurality of wire holders of the aforesaid type arranged at regular intervals on the lead frame. This assembly is adapted for the attachment of the wire holders to the circuit board.

2 Claims, 8 Drawing Sheets

WIRE HOLDER AND WIRE HOLDER ASSEMBLY

This application is a divisional of Application No. 08/377,248, filed on Jan. 24, 1995 now U.S. Pat. No. 5,797,566, the entire contents of which are hereby incorporated by reference.

BACKGROUND OF THE INVENTION

The present invention relates to a wire holder for holding a wire, and more particularly, to a wire holder for holding a wire which, in conjunction with a conduction path of a circuit board, forms an electric circuit, and a wire holder assembly including a plurality of wire holders of this type and adapted for the attachment of the wire holders to the circuit board by means of an automatic loader.

Circuit boards such as printed boards are frequently used in the construction of electric circuits of various electric apparatuses. In this case, conductor patterns for use as conduction paths which constitute the electric circuits are first formed on the printed boards, and various electric circuit components are then mounted on the printed boards.

In an electric apparatus using one such printed board, all the electric circuits on the printed board side may not be able to be formed from the conductor patterns of the printed board only, or it may be improper, in consideration of the circuit configuration, to form all the electric circuits from the conductor patterns, on account of the complexity of the electric circuits and other reasons.

Generally, in this case, required parts such as the conductor patterns are connected to one another by means of a wire, e.g., a vinyl-coated wire. If the wire touches circuit components which are mounted on the printed board, however, an external force acts on the circuit components, so that attachment of the components on the printed board may be loosened, or the conductor patterns may be separated at their junctions with the circuit components, thus possibly resulting in electrical connection failure. Moreover, the wire must be kept away from a high-tension power source. Accordingly, the wire should be held in position on the printed board by means of a wire holder.

A conventional wire holder is formed of a vinyl-coated wire or the like, and its proximal end portion is manually embedded in position in the printed board, to be fixed thereto. The holding of the wire by means of the holder wire can be achieved by manually winding the distal end portion or intermediate portion of the holder wire around the wire.

As described above, the wire holding by means of the conventional wire holder formed of the vinyl-coated wire requires the manual operation, thus entailing high cost. During this manual operation, moreover, an operator sometimes may erroneously apply a force to the wire or bring the wire into contact with the circuit components previously mounted on the printed board. In this case, separation of each conductor pattern on the printed board at its junction with the wire and some other trouble will be caused.

SUMMARY OF THE INVENTION

The object of the present invention is to provide a wire holder which can be automatically mounted on a circuit board and ensures easy and reliable wire holding operation, and a wire holder assembly including a plurality of wire holders of this type and adapted for the attachment of the wire holders to the circuit board by means of an automatic loader.

According to one aspect of the present invention, a wire holder comprises a plate-shaped holder body having opposite sides thereof, a leg portion extending from one side of the holder body, and a wire holding portion extending from the other side of the holder body, the leg portion being arranged so as to be insertable into a hole formed in a circuit board, the wire holding portion being provided so as to be able to introduce a wire into a wire holding space defined by the wire holding portion and to hold the wire introduced into the wire holding space.

According to this wire holder, the wire can be held on the circuit board by only being introduced into the wire holding space. Accordingly, there is no possibility of an operator bringing the wire into contact with components on the printed board by mistake during wire holding operation, so that separation of a conductor pattern on the circuit board and other awkward situations can be avoided securely.

Preferably, the wire holding portion includes first and second wire holding pieces defining the wire holding space in cooperation with each other, both the wire holding pieces having free distal ends, individually, such that the wire can be introduced from between the two free distal ends. According to this preferred embodiment, the wire can be easily introduced into the wire holding space.

Preferably, the first and second wire holding pieces are formed in a manner such that there is not a gap which is wide enough to allow the passage of the wire between the free distal ends of the wire holding pieces when the wire holding pieces are projected on a first plane which contains the holder body, and that there is the gap when the wire holding pieces are projected on a second plane which intersects the first plane. According to this preferred embodiment, the wire can be supported so as not be releasable from the wire holding space by only being rotated around an axis passing through the first plane to change its extending direction after it is introduced into the wire holding space.

Preferably, each of the first and second wire holding pieces includes a proximal end portion extending outward from the holder body, along an axis perpendicular to the first plane, an intermediate portion extending along the first plane from the proximal end portion to the side opposite from the leg portion, and a distal end portion extending inward from the intermediate portion along both the first plane and the edge of the holder body on the other side, the proximal end portions of the two wire holding pieces extending in directions opposite to each other, and the distal end portions extending in directions opposite to each other. According to this preferred embodiment, the wire can be introduced with ease, and can be held securely by only changing its extending direction after the introduction.

Preferably, the respective free distal ends of the first and second wire holding pieces can engage each other. According to this preferred embodiment, the wire can be held so as not be releasable from the wire holding space by only causing the free distal ends of the wire holding pieces to engage each other after the wire is introduced into the holding space.

Preferably, the first and second wire holding pieces are formed in a manner such that there is not a gap which is wide enough to allow the passage of the wire between the free distal ends of the wire holding pieces when the wire holding pieces are projected on a first plane which contains the holder body, and that the respective distal end portions of the wire holding pieces can bend around an axis perpendicular to the first plane, whereby the wire is introduced into the wire holding space from between the free distal ends in a manner such that the distal end portions of the wire holding pieces bend. According to this preferred embodiment, the distal end portions of the wire holding pieces are restored to their original state, thereby holding the wire so as not to be releasable from the wire holding space, after the introduction of the wire, so that the wire can be held securely.

Preferably, at least the wire holding portion is coated with a covering material. According to this preferred embodiment, the wire can be protected.

Preferably, the leg portion includes one or more legs. According to this preferred embodiment, the wire holder can be firmly fixed to the circuit board by adjusting the number, size, and shape of the legs to the method of fixing the wire holder to the circuit board.

Preferably, the holder body is provided with fall-proof portions protruding individually from opposite major surfaces of the holder body, the fall-proof portions serving to support the holder body on the circuit board. According to this preferred embodiment, the wire holder can be firmly fixed to the circuit board.

Preferably, at least one of the one or more legs is formed with an outwardly projecting stopper knot. According to this preferred embodiment, the legs bite well in a solder layer when the wire holder is soldered to the circuit board, so that the wire holder cannot be easily disengaged from the circuit board.

According to another aspect of the present invention, a wire holder assembly has a lead frame formed with a plurality of holes which are arranged at regular intervals and into which feed teeth of an automatic loader are engagedly fitted individually, and a plurality of wire holders arranged at regular intervals on the lead frame, each of the wire holders being constructed in the aforesaid manner.

According to this wire holder assembly, the wire holders can be automatically mounted on the circuit board by means of the automatic loader, so that the necessity of manual operation can be obviated.

Preferably, the plurality of wire holders are stuck to the lead frame by means of a tape. According to this preferred embodiment, the efficiency of utilization of materials is improved, so that the manufacturing cost of the wire holders can be lowered.

DETAILED DESCRIPTION

With reference to the accompanying drawings, a wire holder assembly according to one embodiment of the present invention will now be described.

Figure 1:
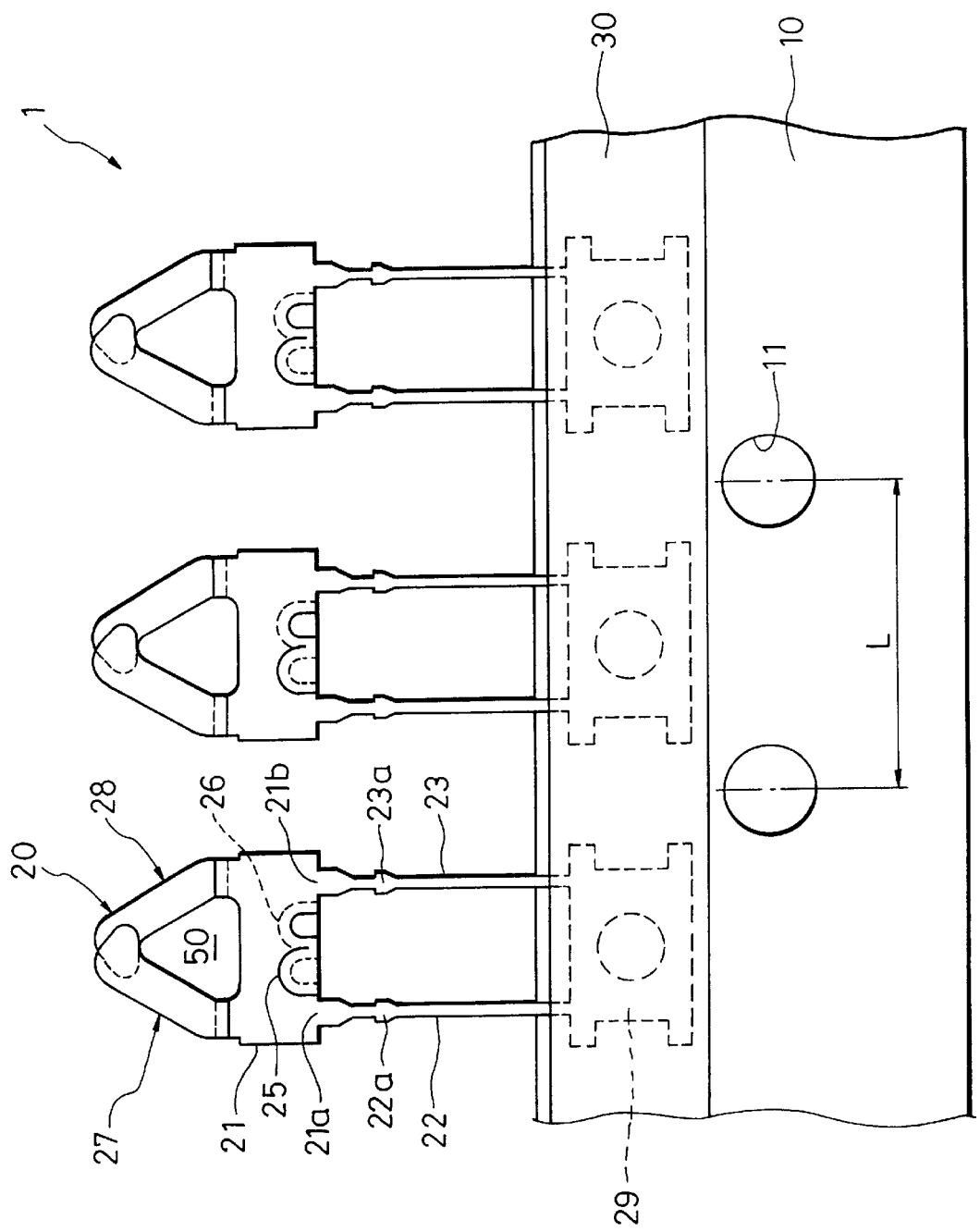
FIG. 1 is a schematic front view showing a wire holder assembly according to one embodiment of the present invention.

Referring to FIG. 1, the wire holder assembly 1 comprises a lead frame 10 and a plurality of wire holders 20 fabricated separately from the frame 10. The wire holders 20 are used to hold in place on a printed board a wire or a wire group (hereinafter referred to simply as wire) which, in conjunction with a conduction path on a circuit board (e.g., conductor pattern formed on the printed board), constitutes an electric circuit. The wire holders 20 are arranged at regular intervals and stuck on the lead frame 10 by means of an adhesive tape 30. The lead frame 10 is formed with a number of perforations 11 which are arranged at regular intervals and into which feed teeth of a sprocket of an automatic wire holder loader (not shown), formed of a commercially available automatic electronic component loader, for example, are engagedly fitted, so that the assembly 1 is transported as the sprocket rotates.

Figure 6:
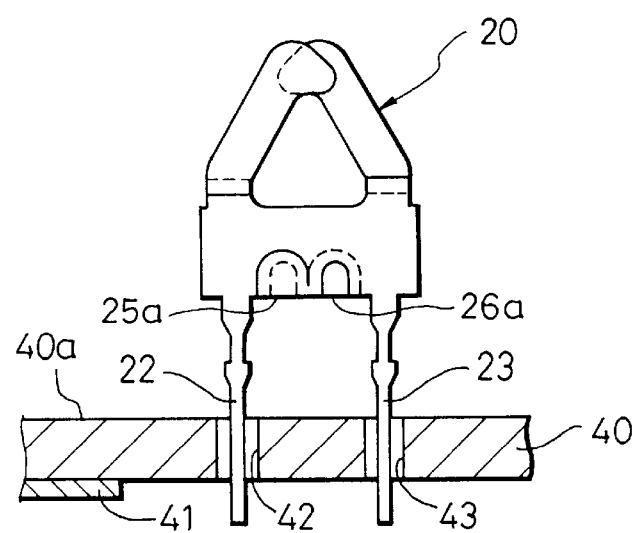
FIG. 6 is a schematic front view, partially in section, showing a state in which legs of the wire holder are inserted in through holes of a printed board.

In FIG. 6, the printed board and the conductor pattern are denoted by reference numerals 40 and 41, respectively. In FIGS. 7 to 10, moreover, a vinyl-coated wire for use as the wire is denoted by numeral 60.

Figure 2:
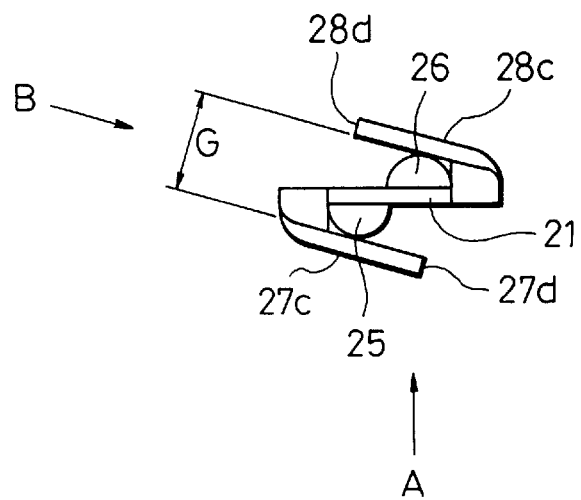
FIG. 2 is a schematic plan view of the wire holder shown in FIG. 1.
Figure 3:
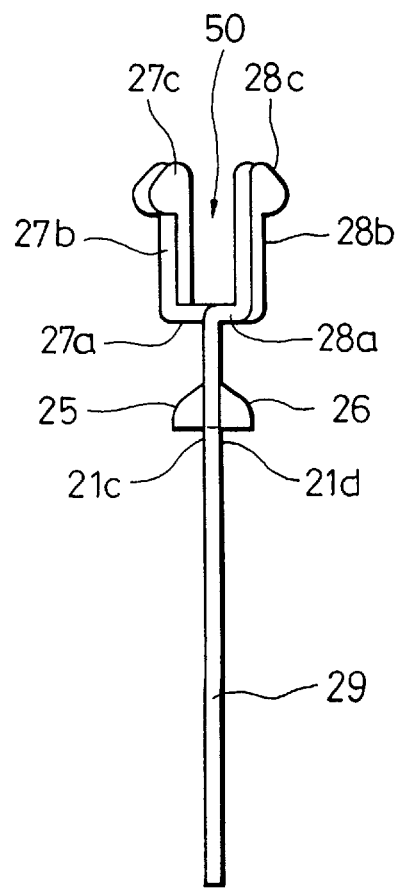
FIG. 3 is a schematic side view of the wire holder shown in FIG. 1.

As shown in FIGS. 1 to 3, each wire holder 20 has a plate-shaped holder body 21, which is provided with first and second legs 22 and 23 formed integrally therewith. The legs 22 and 23 extend downward from the lower edge of the holder body 21, on the opposite sides thereof in the crosswise direction. The legs 22 and 23 are adapted to be inserted individually in two separate through holes 42 and 43 (FIG. 6), which are formed in the printed board 40 in association with the wire holder 20 concerned. Preferably, each of the legs 22 and 23 is formed of a rod having a circular or rectangular cross section, and each of the through holes 42 and 43 of the printed board is formed of a circular hole.

The holder body 21 includes a first edge region 21a extending from the point halfway between the two legs 22 and 23 to the first leg 22 and a second edge region 21b extending from the point halfway between the two legs 22 and 23 to the second leg 23. In the first edge region 21a, a first fall-proof portion 25 for supporting the holder body 21 on the printed board 40 protrudes from one major surface 21c of the body 21. In the second edge region 21b, a second fall-proof portion 26 similar to the first fall-proof portion 25 protrudes from the other major surface 21d of the body 21.

Each of the fall-proof portions 25 and 26 is formed in the shape of a hollow quarter ellipsoid which may be obtained by quadrisecting a hollow ellipsoid of revolution. Bottom surfaces 25a and 26a of these fall-proof portions are designed so as to engage a board face (denoted by numeral 40a in FIG. 6) of the printed board along a semicircular arc each.

Each wire holder 20 is provided with a wire holding portion which includes first and second wire holding pieces 27 and 28. The wire holding pieces 27 and 28, which are formed integrally with the holder body 21, extend upward from the upper edge of the body 21. The wire holding portion is designed so that the wire 60 can be introduced into a wire holding space 50, which is defined by the holding pieces 27 and 28, and so as to hold the wire 60 in the space 50.

More specifically, the first wire holding piece 27 has a proximal end portion 27a extending outward from the upper edge of the holder body 21, along an axis perpendicular to a first plane (designated by symbol P1 in FIG. 7) which contains the body 21, an intermediate portion 27b extending along the first plane from the proximal end portion 27a to the side opposite from the leg 22, a distal end portion 27c extending inward from the intermediate portion 27b along both the first plane and the upper edge of the holder body 21, and a free distal end 27d. Likewise, the second wire holding piece 28 has a proximal end portion 28a, intermediate portion 28b, distal end portion 28c, and free distal end 28d. The respective proximal end portions 27a and 28a of the two wire holding pieces 27 and 28 extend in directions opposite to each other, while the distal end portions 27c and 28c extend in directions opposite to each other.

As seen from FIGS. 1 and 2, the first and second wire holding pieces 27 and 28 are formed in a manner such that there is no gap which is wide enough to allow the passage of the wire 60 between the respective distal end portions 27c and 28c of the holding pieces 27 and 28 and between the free distal ends 27d and 28d thereof when the pieces 27 and 28 are projected on the first plane which contains the holder body 21 (projecting direction is indicated by arrow A in FIG. 2), and that there is a gap G which allows the passage of the wire 60 between the distal end portions 27c and 28c and between the free distal ends 27d and 28d when the pieces 27 and 28 are projected on the second plane (designated by symbol P2 in FIG. 7) which intersects the first plane (projecting direction is indicated by arrow B in FIG. 2). Thus, the wire 60 can be introduced through the gap between the respective free distal ends 27d and 28d of the holding pieces 27 and 28.

In manufacturing the wire holder assembly 1 with the construction described above, an unfinished wire holder strip (not shown), which is formed of a plurality of unfinished wire holders and a frame portion 29 integral therewith, is first punched from a metal strip (not shown) which is formed of brass or the like, by means of a press molding machine (not shown) furnished with a multi-station mold (forward-feed mold), for example. In this case, a first mold (not shown) for punching stopper knots 22a and 23a of each wire holder and a second mold (not shown) for punching the remainder may be used so that the frequency of replacement of the first mold whose life is relatively short can be increased to lower the manufacturing cost.

Figure 4:
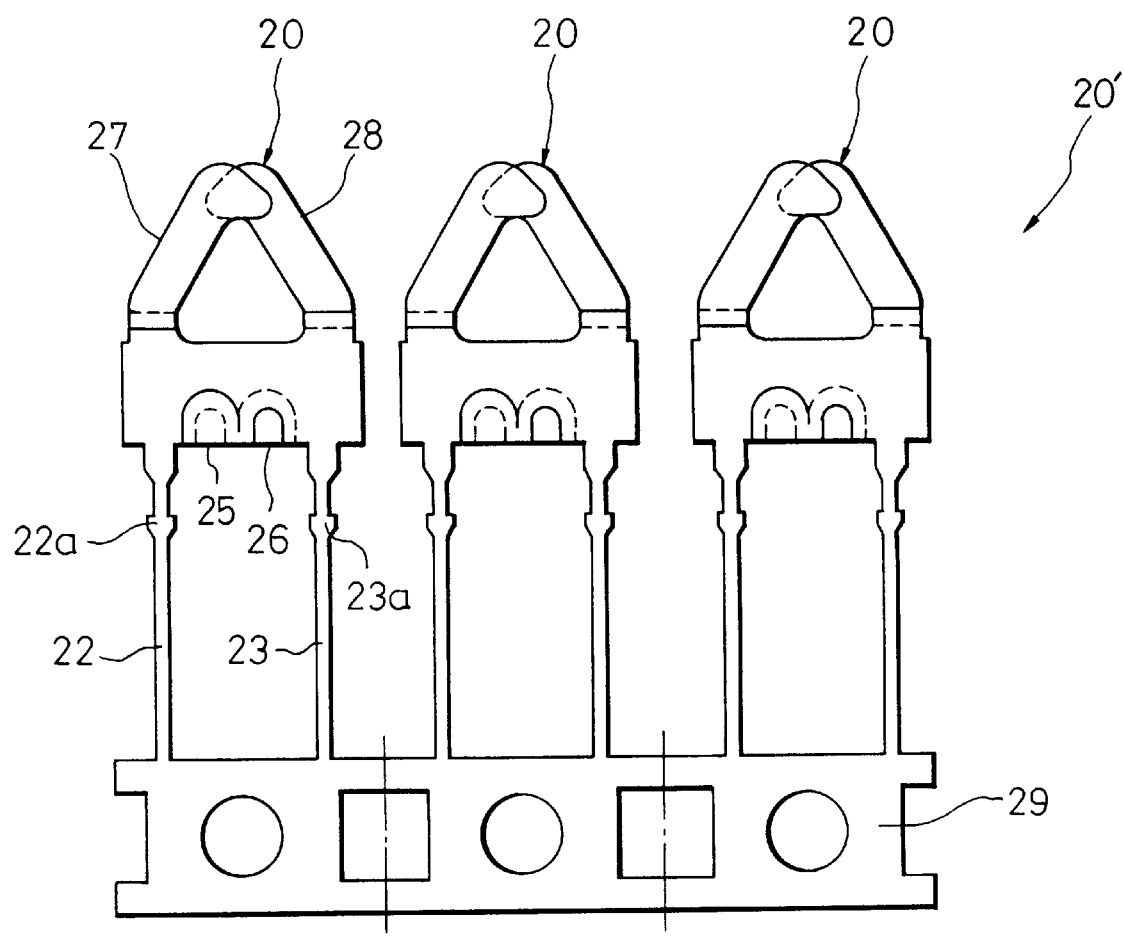
FIG. 4 is a schematic front view showing a wire holder strip as a semi-finished product of the wire holder shown in FIG. 1.

Then, the individual parts of each wire holder are formed in the order of the fall-proof portions 25 and 26, first wire holding piece 27, and second wire holding piece 28, for example. Thus, a molded wire holder strip, which is denoted by reference numeral 20' in FIG. 4, is obtained.

Subsequently, the frame portion 29 of the wire holder strip 20' is cut in positions halfway between the adjacent wire holders, whereupon a plurality of wire holders 20 are obtained. In FIG. 4, cutting lines are represented by one-dotted chain lines. Moreover, the wire holders 20 obtained in this manner are arranged on the lead frame 10 at the same intervals as perforation intervals L in a manner such that each holder 20 is situated halfway between each two adjacent perforations 11 which are bored through the frame 10. The respective frame portions 29 of these wire holders 20 are stuck to the lead frame 10 by means of the adhesive tape 30.

Figure 5:
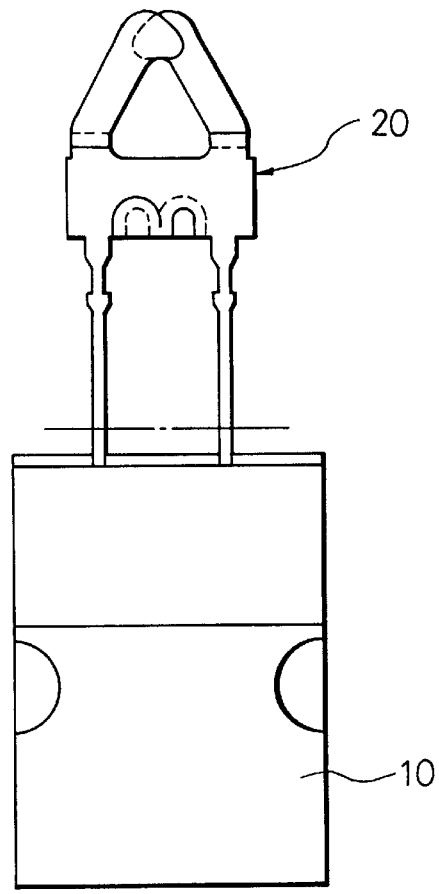
FIG. 5 is a schematic front view showing a combination of a wire holder and a lead frame which are separated from the wire holder assembly of FIG. 1.

In mounting the wire holders 20 on the printed board 40, the perforations 11 of the lead frame 10 of the wire holder assembly 1 are caused to engage the sprocket of the automatic loader, and the loader is then actuated to rotate the sprocket. By doing this, the assembly 1 is transported to the position where its leading wire holder 20 faces a chuck (not shown) of the loader. After the body 21 of the leading wire holder is held by means of the chuck, the chuck is moved so that the assembly 1 is delivered to the position where it faces a cutter (not shown) of the loader. Then, the wire holder assembly 1 is cut along the boundary (generally indicated by one-dotted chain line in FIG. 1) between the leading wire holder 20 and its subsequent one by means of the cutter, whereby a combination (FIG. 5) of the leading wire holder 20 and the lead frame 10 associated therewith is separated from the wire holder assembly 1. Further, after the chuck is horizontally turned to rotate the combination through 90° around the cutter, the junction between the holder 20 and the frame 10 is cut along a cutting line indicated by one-dotted chain line in FIG. 5, by means of the cutter. Thereupon, the lead frame 10 is separated from the wire holder 20.

Subsequently, the chuck is moved to locate the wire holder 20 in a position such that its first and second legs 22 and 23 face the through holes 42 and 43 of the printed board 40, respectively. Thereafter, the chuck is moved so that the holder legs are inserted individually into the through holes (FIG. 6). After the chuck is released so that the wire holder 20 is disengaged from the chuck, the holder 20 is pressed by means of a pusher (not shown) of the automatic loader so that the legs 22 and 23 are further pushed into their corresponding through holes 42 and 43. By doing this, a leg-side edge portion of the holder body 21 is caused to abut against the printed board face 40a. Then, extra portions of the legs 22 and 23 are cut off, and moreover, the respective distal end portions of the legs 22 and 23 which project from the printed board 40 are clinched. Thereupon, automatically loading the printed board 40 with the leading wire holder 20 is finished.

Thereafter, the printed board 40 is automatically loaded with the subsequent wire holders 20, and if necessary, the printed board is loaded with the respective lead wires of other electric and electronic components (not shown). Then, the legs 22 and 23 of each wire holder 20 are fixed to the printed board 40 by flow soldering using a molten solder bath, and if necessary, the respective lead wires of the electric and electronic components are connected electrically and mechanically to the conductor pattern 41 of the printed board 40 by the flow soldering. The holes 42 and 43 of the printed board 40 into which the legs 22 and 23 of the wire holder 20 are inserted are formed separately from each other, so that they have a small diameter. Even if the printed board 40 is subjected to external force during operation, therefore, it is less likely to be damaged. Moreover, each leg 22 or 23 has a narrow cross section and hence a small thermal capacity, so that the flow soldering can be carried out properly. Since the legs 22 and 23 of the wire holder 20 are formed with the stopper knots 22a and 23a, respectively, furthermore, they can bite solder efficiently.

Since mounting the wire holders 20 on the printed board 40 is thus automated, the necessity of manual operation is obviated, and the cost can be reduced.

Figure 7:
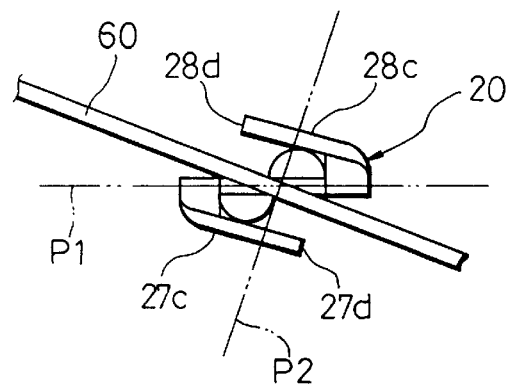
FIG. 7 is a schematic plan view showing a state immediately before a wire is introduced into the wire holder of FIG. 1.
Figure 8:
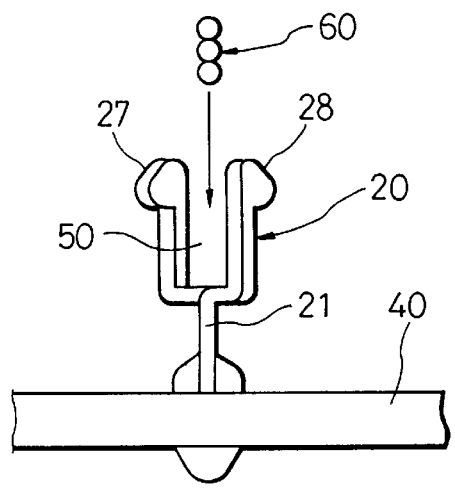
FIG. 8 is a schematic side view showing the state immediately before the wire is introduced into the wire holder of FIG. 1.
Figure 9:
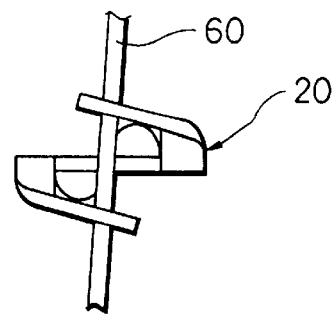
FIG. 9 is a schematic plan view showing a state in which the wire is held by means of the wire holder of FIG. 1.
Figure 10:
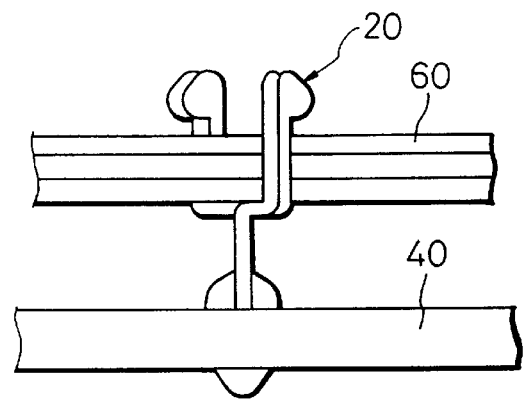
FIG. 10 is a schematic side view showing the state in which the wire is held by means of the wire holder of FIG. 1.

After each wire holder 20 is mounted on the printed board 40, the operator stretches the wire 60 in a direction perpendicular to the second plane P2, which intersects the first plane P2 containing the holder body 21, over the wire holding pieces 27 and 28, as shown in FIGS. 7 and 8. Then, the operator introduces the wire 60 into the wire holding space 50, which is defined by the proximal end portions 27a and 28a, intermediate portions 27b and 28b, and distal end portions 27c and 28c of the wire holder 20, from between the distal end portions 27c and 28c or free distal ends 27d and 28d of the holding pieces 27 and 28. Further, the operator rotates the wire 60 horizontally through about 90°, thereby causing it to extend in a direction substantially perpendicular to the first plane P1 (FIGS. 9 and 10). Thereupon, the wire 60 is held so as not be releasable from the wire holding space 50, by means of the wire holder 20 or its distal end portions 27c and 28c, in particular. Thus, the operator can hold the wire 60 by only introducing it into the wire holding space 50 and then rotating it horizontally. Accordingly, there is hardly any possibility of the operator bringing the wire 60 into contact with the circuit components on the printed board 40 by mistake, thereby causing the conductor pattern 41 on the printed board 40 from being separated. Since the wire 60 can be introduced into the wire holding space 50 of the wire holder 20 from above it, moreover, the wire introducing operation is easy.

Subsequently, the operator connects each end of the wire 60 electrically and mechanically to a required portion of the conductor pattern 41 or a connecting terminal of a component on the printed board 40 by soldering. Alternatively, the operator connects the wire, having a plug or receptacle of a connector (not shown) connected to its wire end, to a receptacle or plug on the side of the printed board 40. If necessary, ends of other wires are connected to the printed board side after being held by means of their corresponding wire holders. Thus, the conductor pattern 41 of the printed board 40, wire 60, etc. constitute an electric circuit on the printed board side. Since the wire 60 is held by means of the wire holder 20, it can hardly be erroneously brought into contact with the circuit components on the printed board 40 during operation for the connection of its end to the board 40.

The wire may be introduced into the wire holder to be held thereby after the wire end is connected electrically to the conductor pattern or the like.

It is to be understood that the present invention is not limited to the embodiment described above, and that various changes and modifications may be effected therein by one skilled in the art without departing from the scope or spirit of the invention.

Figure 17:
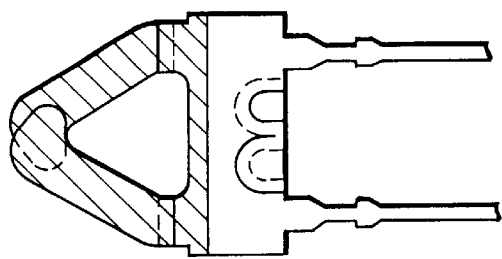
FIG. 17 is a schematic partial front view showing a vinyl-coated region according to a further modification of the invention.

For example, the wire holding pieces 27 and 28 of the wire holder 20 and a holding-piece-side portion of the holder body 21 may be coated with vinyl, as indicated by hatching in FIG. 17, so that the wire 60 in the wire holding space 50 of the holder can be protected thereby.

Figure 11:
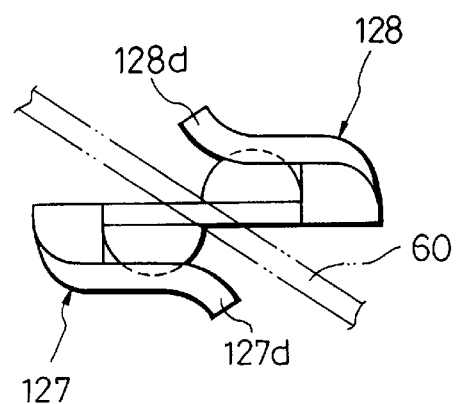
FIG. 11 is a schematic plan view showing a state in which the wire is received in a wire holder according to a modification of the invention.
Figure 12:
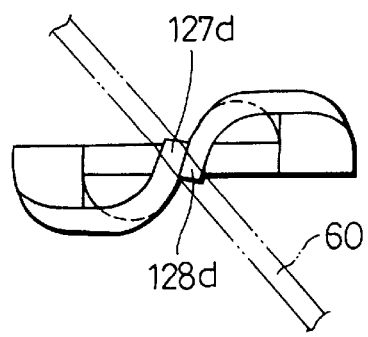
FIG. 12 is a schematic plan view showing a state in which the wire is held by means of the wire holder of FIG. 11.

According to the aforementioned embodiment, moreover, the wire holding pieces 27 and 28 of the wire holder 20 are formed in a manner such that there is the gap G between the distal end portions 27c and 28c which extend along the first plane P1 containing the holder body 21, and the wire 60 is horizontally rotated to change its extending direction so that it cannot slip out of the wire holding space 50 after it is introduced into the holding space. Alternatively, however, the two holding pieces may be arranged so that their respective free distal ends can engage each other. FIGS. 11 and 12 show a wire holder according to this modification. In this case, the wire 60 is introduced into the wire holding space in the state of FIG. 11 in which the free distal ends 127d and 128d of the wire holding pieces 127 and 128 are not in engagement with each other. Then, the free distal ends 127d and 128d are caused to engage each other, as shown in FIG. 12, whereby the wire 60 is unreleasably held in the holding space 50.

Figure 13:
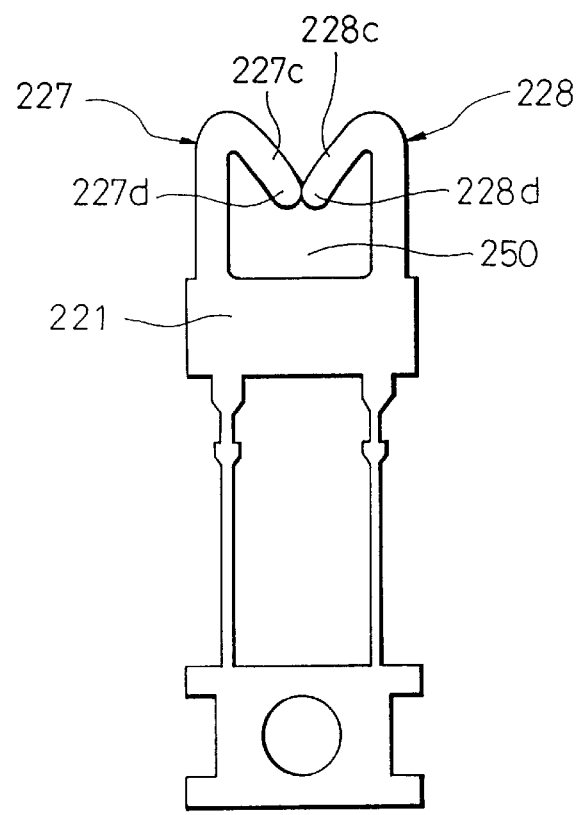
FIG. 13 is a schematic front view of a wire holder according to another modification of the invention.

A wire holder according to another modification shown in FIG. 13 has a holder body 221 and first and second wire holding pieces 227 and 228. This wire holder is formed so that there is no gap between free distal ends 227d and 228d of the holding pieces 227 and 228 when the holding pieces are projected on a plane which contains the holder body 221, and that distal end portions 227c and 228c of the wire holding pieces can bend around an axis which intersects the projection plane at right angles thereto. The two wire holding pieces 227 and 228 may be spaced in the thickness direction of the holder body 221 so that the wire can be passed between them, or be in contact with each other. In this case, the operator pushes the wire into a wire holding space 250 from between the free distal ends 227d and 228d of the wire holding pieces 227 and 228 in a manner such that the distal end portions 227c and 228c of the holding pieces bend. When the wire is introduced into the wire holding space 250 in this manner, the distal end portions 227c and 228c of the wire holding pieces are elastically restored to their original state, so that the wire is unreleasably held in the space 250. Although the wire holder of this modification, like the one according to the foregoing embodiment, can be formed of brass material, it may alternatively be formed of synthetic material. In the embodiment and modifications described above, the wire holder is not limited to any special materials. In the case where the wire holder is fixed to the printed board or other circuit board by soldering, however, at least the leg portion of the holder should be formed from metal material.

Although the wire holding portion of the wire holder is composed of the two wire holding pieces according to the embodiment and modifications described above, moreover, this arrangement is not essential. For example, the wire holding portion may be formed of one wire holding piece (not shown) which extends in the form of an inverted U from one end side of the holder body. In this case, a gap which can receive the wire is formed between the distal end of the wire holding piece and the one side of the holder body. Thus, according to the present invention, the gap for receiving the wire can be formed in some other regions than the position over the wire holder.

Figure 14:
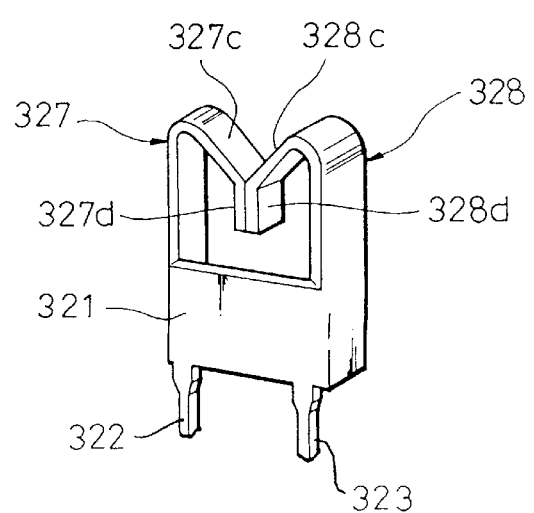
FIG. 14 is a schematic front view of a wire holder according to still another modification of the invention.

FIG. 14 shows a wire holder according to a further modification. This wire holder is analogous to one shown in FIG. 13, and includes first and second wire holding pieces 327 and 328 each having a width which is considerably larger than the thickness of a holder body 321, as compared with the wire holder shown in FIG. 13.

For the manufacture of the wire holder, first, a metal strip is stamped into a wire holder strip (not shown) having a shape which is equivalent to a developed shape of the wire holder shown in FIG. 14. Next, tip portions 327c, 328c and free ends 327d, 328d of the wire holding piece 327, 328 are bent in an illustrated way. Then, the holder body 321 is bent at locations in the width direction just outside its legs 322, 323.

Wire holding with use of the wire holder shown in FIG. 14 is carried out in substantially the same manner as in the case where the wire holder shown in FIG. 13 is used. Thus, an explanation of the operation of the wire holder shown in FIG. 14 will be omitted.

Figure 15:
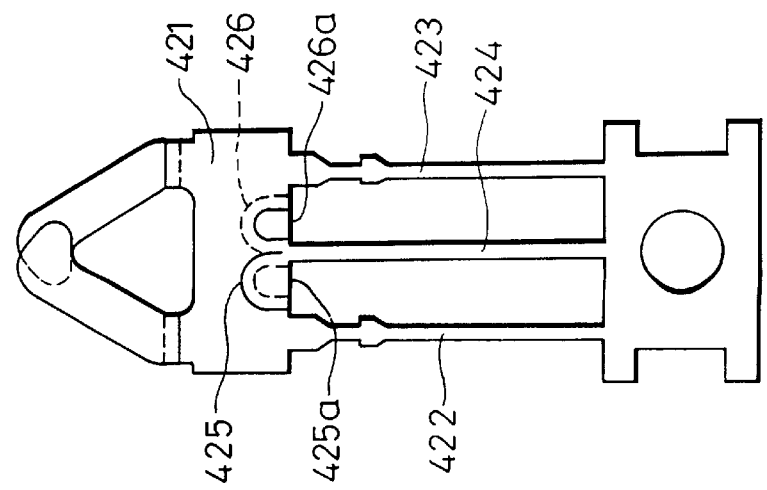
FIG. 15 is a schematic front view of a wire holder according to a further modification of the invention.

Although the wire holder 20 is provided with the two legs 22 and 23 according to the foregoing embodiment, furthermore, the number of the legs is not limited to two. A wire holder according to a modification shown in FIG. 15 is provided with three legs 422, 423 and 424. A holder body 421 is formed with fall-proof portions 425 and 426. When the legs 422, 424 and 424 are inserted into through holes of the printed board, the outermost region of a fall-proof portion bottom face 425a or 426a which is in contact with the surface of the printed board, the first or second leg 422 or 423 corresponding thereto, and the third leg 424 forms an isosceles triangle on the surface of the printed board. When an external force is applied to one major surface of the wire holder, it is received by the three legs and the one fall-proof portion, so that loads act on the legs without any substantial imbalance.

Figure 16:
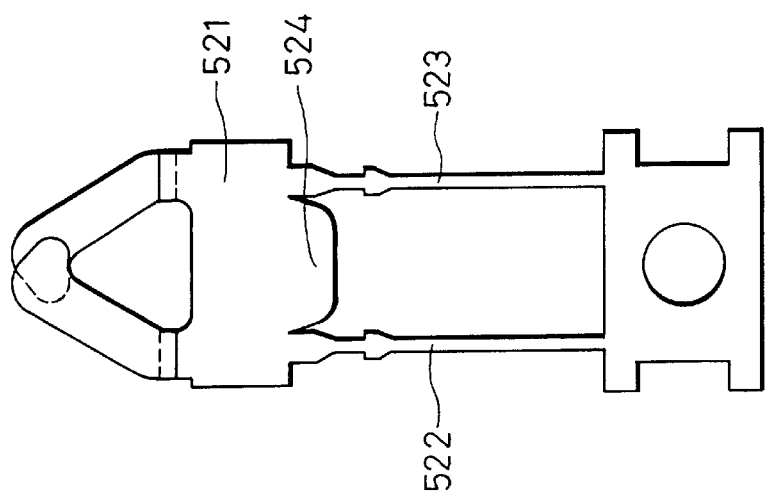
FIG. 16 is a schematic front view of a wire holder according to an additional modification of the invention.

In a wire holder according to another modification shown in FIG. 16, a holder supporting portion 524 is formed integrally with a holder body 521 in a position between two legs 522 and 523. The holder body 524 securely supports the wire holder which is fitted in a slot of the printed board and soldered to the printed board. Thus, this modification is not provided with any fall-proof portions. Also in the embodiment and modifications described above, the fall-proof portions 25 and 26 and the like are not essential elements. The stopper knots 22a and 23a are not essential either.

In the embodiment described above, the wire holder assembly 1 is obtained by sticking the plurality of wire holders 20 to the lead frame 10 by means of the tape 30, the holders 20 being obtained by cutting the wire holder strip 20' with the wire holders 20 arranged thereon at intervals shorter than the intervals between the sprocket teeth of the automatic loader, in order to improve the efficiency of utilization of the strip 20' as a material. Alternatively, however, a wire holder strip having wire holders arranged at intervals equal to the sprocket tooth intervals may be used as the wire holder assembly. In this case, perforations are formed in the strip at intervals equal to the sprocket tooth intervals.

What is claimed is:

1. A wire holder comprising:

a plate-shaped holder body having a first side and a second side;

a leg portion extending from said first side of said holder body; and a wire holding portion extending from said second side of said holder body, said leg portion being arranged so as to be insertable into a hole formed in a circuit board, said wire holding portion capable of holding a wire in a wire holding space defined by said wire holding portion, said wire holding portion includes first and second wire holding pieces defining said wire holding space in cooperation with each other, both said wire holding pieces having free distal ends, individually, such that a wire can be introduced from between said two free distal ends, said first and second wire holding pieces are formed in a manner such that there is not a gap which is wide enough to allow passage of a wire between said free distal ends of said wire holding pieces when said wire holding pieces are projected on a first plane which contains said holder body, and that the respective distal end portions of said wire holding pieces can bend around an axis perpendicular to said first plane, whereby a wire can be introduced into said wire holding space from between said free distal ends in a manner such that said distal end portions of said wire holding pieces bend.

2. A wire holder assembly comprising:

a lead frame formed with a plurality of holes which are arranged at regular intervals and into which feed teeth of an automatic loader are engagedly fitted individually;

a plurality of wire holders arranged at regular intervals on the lead frame, each said wire holder comprising:

a plate-shaped holder body having a first and a second side;

a leg portion extending from said first side of said holder body; and a wire holding portion extending from said second side of said holder body, said leg portion being arranged so as to be insertable into a hole formed in a circuit board, said wire holding portion capable of holding a wire in a wire holding space defined by said wire holding portion; said plurality of wire holders are fastened to said lead frame by means of a tape, said wire holding portion includes first and second wire holding pieces defining said wire holding space in cooperation with each other, both said wire holding pieces having free distal ends, individually, such that a wire can be introduced from between said two free distal ends, said first and second wire holding pieces are formed in a manner such that there is not a gap which is wide enough to allow passage of a wire between said free distal ends of said wire holding pieces when said wire holding pieces are projected on a first plane which contains said holder body, and that the respective distal end portions of said wire holding pieces can bend around an axis perpendicular to said first plane, whereby a wire can be introduced into said wire holding space from between said free distal ends in a manner such that said distal end portions of said wire holding pieces bend.

* * * * *